United States Patent [19]

Vogelsong et al.

[11] 4,284,907
[45] Aug. 18, 1981

[54] CHARGE TRANSFER FILTER

[75] Inventors: Thomas L. Vogelsong; Jerome J. Tiemann, both of Schenectady, N.Y.

[73] Assignee: General Electric Company, Schenectady, N.Y.

[21] Appl. No.: 132,777

[22] Filed: Mar. 24, 1980

[51] Int. Cl.³ .................... G11C 19/28; H01L 29/78; H03H 15/02
[52] U.S. Cl. ................. 307/221 D; 357/24; 333/165
[58] Field of Search ............... 357/24; 307/221 D; 333/165

[56] References Cited

U.S. PATENT DOCUMENTS

| 4,124,861 | 11/1978 | Baertsch et al. | 357/24 |
| 4,124,862 | 11/1978 | Engeler et al. | 357/24 |
| 4,172,983 | 10/1979 | MacLennan | 307/221 D |

Primary Examiner—Gene M. Munson
Attorney, Agent, or Firm—Julius J. Zaskalicky; James C. Davis, Jr.; Marvin Snyder

[57] ABSTRACT

A charge transfer filter utilizing a charge transfer accumulator structure for exponential smoothing of sampled data signals is described. The charge transfer accumulator structure performs charge equilibration at high speed thereby enabling an exponential decay impulse response to be obtained at high speed.

3 Claims, 10 Drawing Figures

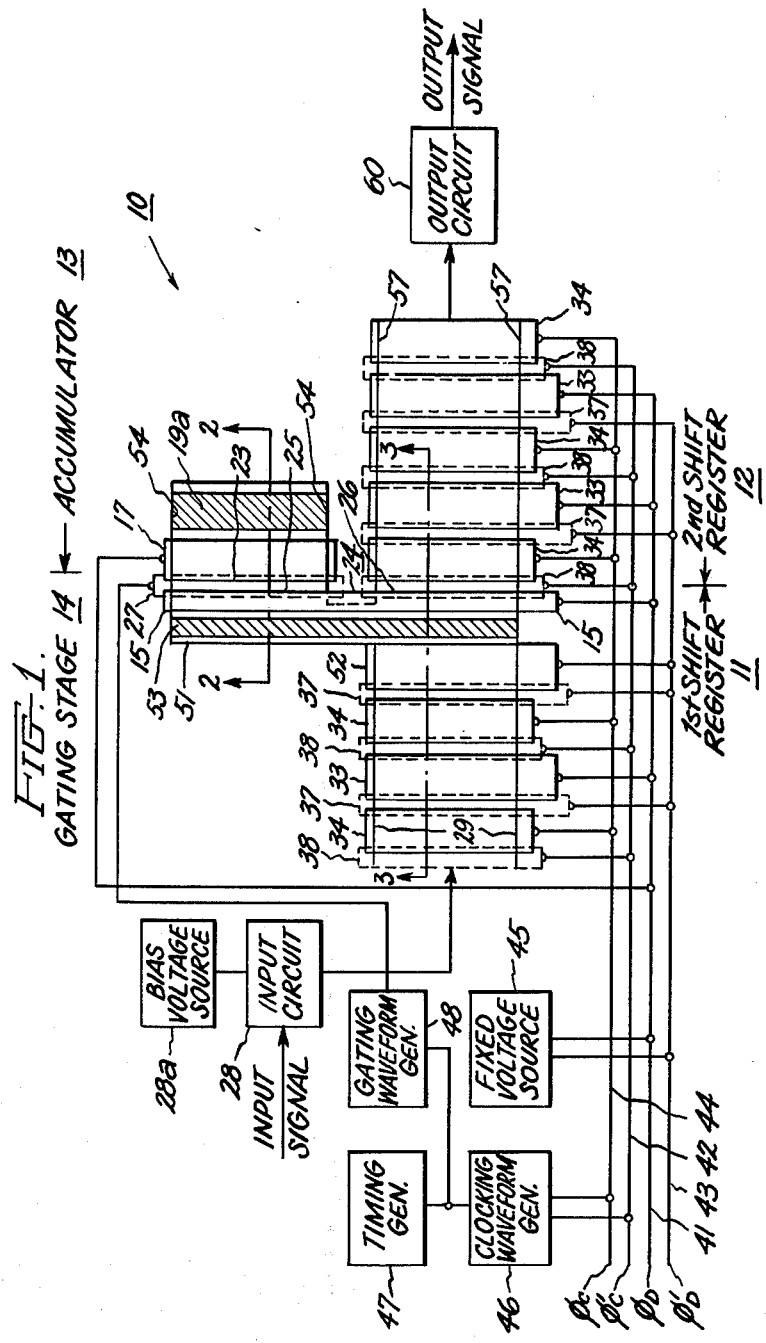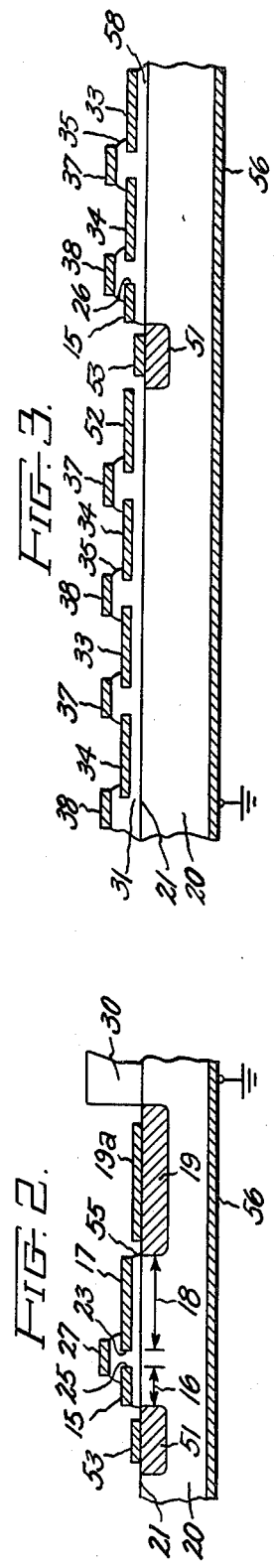

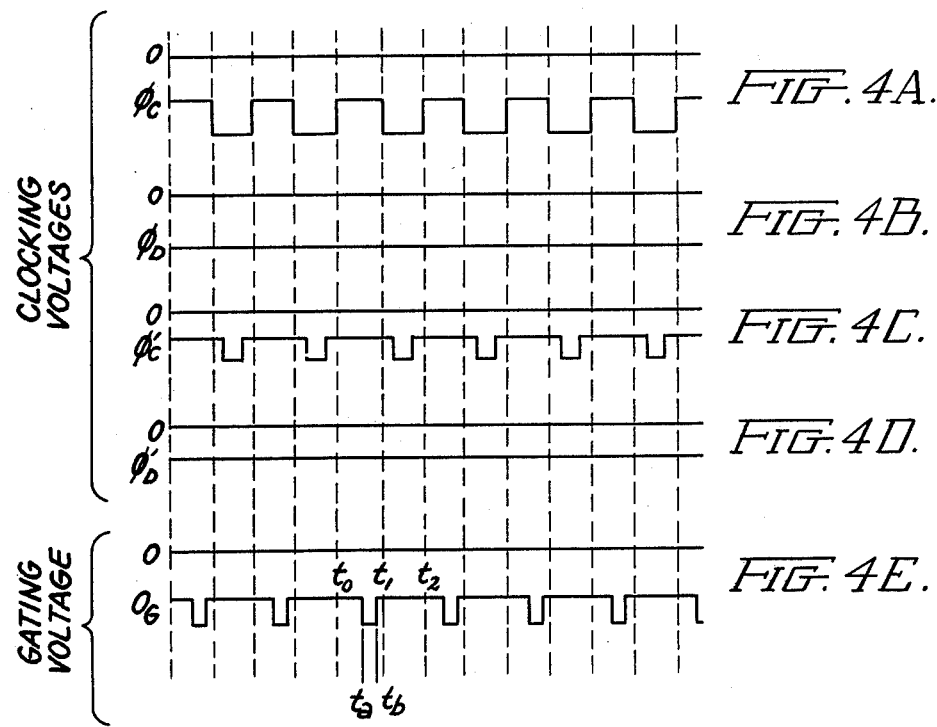
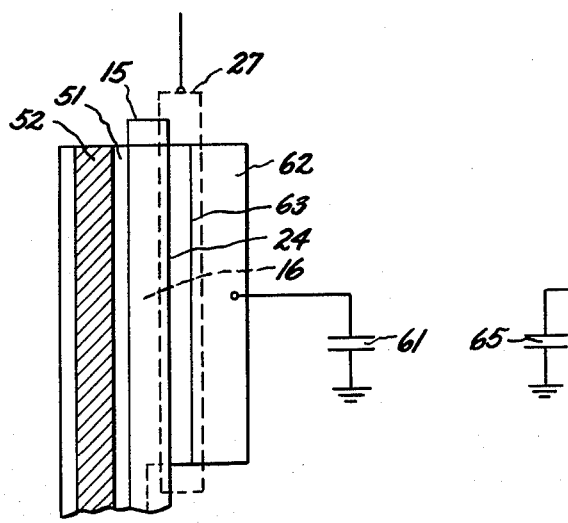
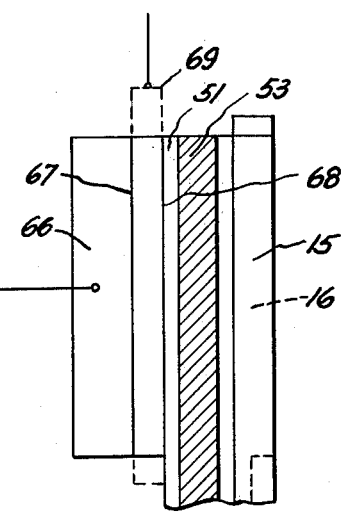

CHARGE TRANSFER FILTER

The present invention relates in general to charge transfer devices and more particularly to charge transfer structures for providing exponential smoothing of sampled data signals.

The present invention relates particularly to filter structures of the type described in U.S. Pat. Nos. 4,124,862, Engeler, et al., 4,124,861, Engeler, et al., and 4,172,983, MacLennan, all of which are of common assignee herewith.

An object of the present invention is to provide improvements in the charge transfer filters of the aforementioned type.

Another object of the present invention is to provide a charge transfer filter of the aforementioned type capable of operation at higher speeds than heretofore possible.

A further object of the present invention is to provide a charge transfer filter structure of the aforementioned type which is relatively simple in structure and organization.

In carrying out the invention in one illustrative embodiment thereof there is provided a substrate of semiconcuctor material of one conductivity type. Means are provided for forming a charge storage cell in the substrate and for transferring charge therein including a first electrode of generally elongated outline and a third electrode of generally elongated outline, each of which insulatingly overlies the storage cell. The first electrode forming with the substrate a first capacitor. The third electrode forming with the substrate a third capacitor. The first electrode has a length in the direction of charge transfer thereunder which is substantially smaller than the width thereof. The third electrode has a length in the direction of charge transfer thereunder which is substantially smaller than the width thereof. A long edge of the third electrode is spaced a short distance from and parallel to a part of a long edge of the first electrode. A sequence of first quantities of charge is provided, each quantity corresponding to a respective value of a series of successive values of an analog signal. Introducing means including the first electrode are provided for introducing serially each of the first quantities of charge of the sequence into the storage cell. Removing means including the first electrode are provided for removing periodically a fixed fraction less than one of the total of the first quantities of charge contained in the storage cell to provide a sequence of second quantities of charge. The fixed fraction of charge periodically removed from the storage cell by the removing means is determined by the ratio of the capacitance of the first capacitor to the total capacitance of the first and third capacitors.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIG. 1 shows a plan view of one embodiment of the charge transfer filter structure in accordance with the present invention.

FIG. 2 shows a sectional view of the apparatus of FIG. 1 taken along section lines 2—2 of FIG. 1.

FIG. 3 shows a sectional view of the apparatus of FIG. 1 taken along section lines 3—3 of FIG. 1.

FIGS. 4A through 4E show diagrams of voltage waveforms useful in explaining the operation of the apparatus of the present invention.

FIG. 5 shows a plan view of a modification of the embodiment of FIG. 1.

FIG. 6 shows a plan view of another modification of the embodiment of FIG. 1.

Reference is now made to FIGS. 1-3 which show apparatus 10 in accordance with the present invention. The apparatus is formed on a common semiconductor substrate 20 having a major surface 21 and comprises a first serial charge transfer shift register 11, a second serial charge transfer shift register 12, an accumulator stage 13 and a gating stage 14. The last stage of the first shift register 11 includes a first electrode 15 of generally rectangular outline insulatingly overlying the major surface of the substrate and providing a first storage region 16 therewith. The accumulator stage 13 includes a third electrode 17 of generally rectangular outline insulatingly overlying the major surface of the substrate and providing a third storage region 18 therewith. A long edge 23 of the third electrode 17 is spaced a short distance from and parallel to a part 25 of a long edge 24 of the first electrode 15. The gating stage 14 includes a gating electrode 27 insulatingly overlying the first and third electrodes for establishing a conduction channel between the first and third storage regions. The second shift register 12 is coupled to the first shift register 11 along another part 26 of the long edge 24 of the first electrode.

A sequence of packets of charge corresponding to samples of an analog signal from an input circuit 28 are serially applied to the first shift register 11 and are clocked from stage to stage. During one-half of a clocking cycle a charge packet is clocked into the first storage region 16 of the last stage and stored or contained therein. During an interval of this half of the clocking cycle, actuation of the gating stage 14 establishes a conduction channel between the first storage region 16 and the third storage region 18 to combine the charges in these storage regions. Upon de-actuation of the gating stage the combined charge in the first and third storage regions is divided into a first part contained in the first storage region and a second part contained in the third storage region. The first part of the combined charge is transferred out of the first storage region into the second shift register 12 during the second half of the clocking cycle. The second part of the combined charge is stored or contained in the third storage region for processing over succeeding clocking cycles. The first and third storage regions constitute a charge storage cell. The charge stored in the first storage region is proportional to the capacitance of the first electrode with respect to the substrate, referred to as the first capacitor, and the charge stored in the third storage region is proportional to the capacitance of the third electrode with respect to the substrate, referred to as the third capacitor. The first part of the combined charge is equal to the ratio of capacitance of the first capacitor divided by the sum of the capacitance of the first and third capacitors. The second part of the combined charge is equal to the ratio of the capacitance of the third capacitor divided by the sum of the capacitances of the first and third capacitors.

The apparatus 10 is formed on a semiconductor substrate 20 of N-type conductivity having a major surface 21. Typically, the substrate may be silicon semiconductor material of suitable resistivity, for example, 4 ohm-centimeters. The shift register 11 is formed over a channel portion 29 of the substrate 20. Overlying the major surface 21 of the substrate 20 is a thick insulating member 30 of silicon dioxide having a thin portion 31, for example 1000 Angstroms thick, lying in registry with the channel portion 29. A plurality of first electrodes 33 of generally rectangular outline is provided on the insulating member 30 overlying the thin portion 31. Each of the first electrodes is of uniform length in the direction of the length dimension of the channel portion 29, i.e. in the direction of charge transfer. The length of each of the electrodes is also substantially smaller than the width dimension thereof. Each of the first electrodes 33 have portions which extend over the thick insulation portions of the insulating member 30 bordering the thin insulating portion 31. A plurality of second electrodes 34 is provided on the insulating member 30 overlying the thin portion 31. Each of the electrodes is of uniform length in the direction of the length dimension of the channel portion 29 and equal to the uniform length of the first electrodes 33. Each of the electrodes 34 have portions which extend over the thick insulating portions of insulating member 30 bordering the thin insulating portion. Another thin layer 35 of insulation, for example 1000 Angstroms thick, is provided over the electrodes 33 and 34. A plurality of first transfer electrodes 37 are provided over the insulating layer 35. Each of the first transfer electrodes 37 is insulatingly spaced between a respective second electrode 34 and an adjacent succeeding first electrode 33 and overlying these electrodes. A plurality of second transfer electrodes 38 are provided over the insulatingly layer 35. Each of the second transfer electrodes 38 is insulatingly spaced between a respective first electrode 33 and an adjacent succeeding second electrode 34 and overlying these electrodes. Each of the transfer electrodes 37 and 38 is of substantially uniform extent in the direction of the length of the channel portion 29 and extends over the thin insulating portion of the insulating member 30 as well as the bordering thick insulating portions thereof. The first and second transfer electrodes are shown in dotted outline to illustrate with clarity the structure and organization of the apparatus.

All of the first electrodes 33 of the shift register 11 are connected to a line 41 to which a $\phi_D$ voltage is supplied from a fixed voltage source 45. All of the second electrodes 34 of the shift register 11 are connected to line 42 to which a $\phi_C$ voltage is supplied from a clocking waveform generator 46. The clocking waveform generator 46 is under the control of the timing generator 47. All of the first transfer electrodes 37 of the shift register 11 are connected to a $\phi_D{'}$ line 43 to which a $\phi_D{'}$ voltage is supplied from fixed voltage source 45. All of the second transfer electrodes 38 of the shift register 11 are connected to a $\phi_C{'}$ line 44 to which a $\phi_C{'}$ voltage is applied from a clocking waveform generator 46. The $\phi_C$, $\phi_D$, $\phi_C{'}$, and the $\phi_D{'}$ voltage waveforms are shown in FIGS. 4A through 4D, respectively. A conductive layer 56 of a suitable material such as gold is eutectically bonded to the lower surface of the substrate 20 to provide a substrate contact to which the ground line of the $\phi_D$, $\phi_D{'}$, $\phi_C$ and $\phi_C{'}$ voltage sources are connected.

Each set of four electrodes 38, 34, 37, and 33, serially arranged on a respective thin portion 31 of the insulating member 30 and overlying a respective part of channel 29, form a stage of shift register 11. The last stage of shift register 11 includes in addition to these four electrodes, specifically designated electrodes 38, 34 37 and 15, an elongated high conductivity region 51 of opposite conductivity type in the channel portion 29 of uniform length, and an auxiliary electrode 52 of the same length as a first storage electrode 33. The auxiliary electrode 52 is insulatingly spaced from the substrate the same distance as the first electrode 33 is spaced therefrom and has a long edge underlying electrode 37. One long edge of the region 51 underlies a long edge of electrode 15 and the other long edge thereof underlies an adjacent long edge of the auxiliary electrode 52. The elongated high conductivity region 51 of opposite conductivity type provides improved lateral conductivity in the storage region formed under electrode 15 as majority carrier conduction therein is inherently much faster than minority carrier equilibration in the storage region. The conductivity of the elongated region 51 is enhanced by an elongated metal strip 53 bonded to it. The auxiliary electrode 52 is connected to line 43 which provides a $\phi_D{'}$ voltage thereto. The auxiliary electrode is provided to facilitate the formation of the leading edge of the elongated region 51. The operating potential applied to the auxiliary electrode 52 is selected which enables the transfer of charge from a storage region underlying a second storage electrode 34 to a storage region underlying a first storage electrode 33.

The accumulator stage 13 is formed on channel portion 54 of the substrate which is laterally spaced from the channel portion 29 and abutting storage region 16 thereof. A thin insulating portion 55 is provided in registry with the channel portion 54. A third electrode 17 of elongated outline is provided overlying a portion of the thin insulating layer. The long edge of the electrode 17 is spaced a short distance from and parallel to a part 27 of an adjacent long edge 25 of the first electrode 15. The third electrode 17 is connected to line 41 on which a $\phi_D$ appears. Thus, with the application of this potential to the third electrode, a third storage region 18 is provided in the substrate. The capacitance of the storage region 18 with respect to overlying electrode is augmented by providing in the channel portion 54 of the substrate a second region 19 of opposite conductivity type and of elongated outline having a long side contiguous with the long side of the storage region 18. The area of the second region 19 in the surface of the substrate is set equal to the area of the first region 51 in the surface of the substrate multiplied by the ratio of the area of the third electrode to the area of the first electrode. The parallel combination of the dielectic capacitance of the storage region 16 with respect to the overlying clocking electrode 15, the depletion capacitance of the storage region 16, and the depletion capacitance of the region 51 of opposite conductivity type with respect to the substrate constitutes a first capacitance, representing the capacitance of the first capacitor referred to above. The parallel combination of the dielectric capacitance of the storage region 18 with respect to the overlying electrode 17, the depletion capacitance of storage region 18, and the depletion capacitance of the region 19 of opposite conductivity type with respect to the substrate constitutes a third capacitance, representing the capacitance of the third capacitor referred to above. The dielectric capacitance of the third capacitor is equal to the dielectric capacitance of the first capacitor multiplied by the ratio of the area of the third electrode to the area of the first electrode. The depletion capacitance of the third storage region is substantially equal to the depletion capacitance of the first storage region multiplied by the same ratio. The depletion capacitance of the second region 19 is substantially equal to the depletion capacitance of the first region multiplied by the same ratio. Thus, the ratio of the capacitance of the first capacitor to the sum of the capacitances of the first and third capacitors is substantially equal to the ratio of the area of the first electrode to the sum of the areas of the first and third electrodes. While the depletion capacitance components of the first and third capacitors vary with the charge stored thereon, the total depletion capacitance of the third capacitor maintains a fixed relationship to the total depletion capacitance of the first capacitor in view the aforementioned preset relationships. Thus, the aforementioned ratio is maintained fixed and is independent of the charge stored in the first and third storage regions. As conductive strip 53 is provided over the region 51 of opposite conductivity type and also contributes to the value of the first capacitance, conductive strip 19a is also provided over the surface of region 19 of opposite conductivity type to provide a corresponding contribution to the third capacitance thereby contributing to maintaining the aforementioned ratio independent of stored charge.

The gating stage 14 is formed on the channel portion 54 and includes a gating electrode 27 insulatingly overlying the adjacent long edges of electrodes 15 and 17. The gating electrode 27 is connected to gating waveform generator 48 which provides gating voltage $\phi_G$, as shown in FIG. 4E. The gating waveform generator 48 is synchronized with the timing generator 47. When the gate voltage $\phi_G$ is applied to the gate electrode 27 a conductive channel is formed in the underlying the surface adjacent region of the substrate 20 which enables equilibration of charge in the first storage region 16 underlying the electrode 15 of the shift register 11 with the charge in the third storage region 18 underlying the electrode 17 of the accumulator stage 13.

Each stage of the shift register 11 includes a $\phi_D$ storage region underlying a $\phi_D$ electrode 33 and a $\phi_C$ storage region underlying a $\phi_C$ electrode 34. The $\phi_D$ voltage applied to the $\phi_D$ electrode is fixed and produces a surface potential in the substrate underlying the $\phi_D$ electrode which is fixed. The $\phi_C$ voltage applied to the $\phi_C$ electrode cycles between a high level and a low level above and below the $\phi_D$ voltage and produces a surface potential in the substrate underlying the $\phi_C$ electrode which cycles between a level above and below the fixed level underlying a $\phi_D$ electrode. When the $\phi_C$ voltage is at its high level, charge transfer is enabled from the $\phi_C$ storage region to the $\phi_D$ storage region, and conversely when the $\phi_C$ voltage is at its low level, charge transferred from the $\phi_D$ storage region to the $\phi_C$ storage region is enabled. Each stage also includes a $\phi_D'$ electrode 37 to which is applied a $\phi_D'$ voltage of fixed value which produces a surface potential in the substrate underlying the electrode which is smaller in absolute magnitude than the surface potential underlying a $\phi_D$ electrode. Each stage also includes a $\phi_C'$ electrode 38 to which is applied a $\phi_C'$ voltage having two levels. At the upper level a surface potential is produced in the substrate underlying the electrode which inhibits the transfer of charge from a $\phi_D$ storage region to a $\phi_C$ storage region. At the lower level a surface potential is produced enabling the transfer of charge from a $\phi_D$ storage region to a $\phi_C$ storage region. Thus, when the $\phi_C$ voltage is at its high level, charge is transferred from a $\phi_C$ storage cell to a $\phi_D$ storage cell, and when both the $\phi_C$ voltage and the $\phi_C'$ voltage are at their low levels, charge is transferred from a $\phi_D$ storage cell to a $\phi_C$ storage cell. For each cycle of the clocking voltages $\phi_C$ and $\phi_C'$, charge is transferred from a $\phi_C$ storage cell to a $\phi_D$ storage cell and then to the next succeeding $\phi_C$ storage cell.

Packets of charge for insertion into the shift register 11 are generated by an input circuit 28 in response to an analog input signal. Input circuits such as input circuit 28, are well-known in the art, one of which is described in connection with FIGS. 8A, 8B and 8C in the U.S. Pat. No. 4,032,867, assigned to the assignee of the present invention and incorporated herein by reference thereto. This particular circuit is referred to as a "fill and spill" circuit. Of course, other input circuits may be utilized. A bias voltage source 28a connected to the input circuit 28 provides a fixed bias charge component to each packet of charge developed by the input circuit 28a which facilitates the transfer thereof. The output of the input circuit 28 is applied to the input stage of the first shift register 11.

After a charge packet has been clocked into the last stage of shift register 11 and has been equilibrated and divided in the accumulator stage 13 of the apparatus in a manner to be explained below, the resultant packet of charge is contained in the storage regions underlying the $\phi_D$ electrode 15. The resultant packet of charge is then clocked into a second shift register 12 and sensed in an output circuit 69 from which an output signal is obtained. An output circuit suitable for providing an output in accordance with the sequence of packets of charge clocked thereinto is described in connection with FIG. 6 of patent application Ser. No. 105,756, filed Dec. 20, 1979, assigned to the assignee of the present invention and incorporated herein by reference thereto.

The second shift register 12 is formed on a channel portion 57 of the substrate 20 which is an extension of channel portion 29 but of substantially smaller width. A thin portion 58 is provided in thick insulating member 30 lying in registry with the channel portion 57. A plurality of first electrodes 33 of generally rectangular outline is provided on the insulating member 30 overlying the thin portion 58. Each of the first electrodes 33 is of uniform length in the direction of the length dimension of the channel portion 57, i.e. in the direction of charge transfer. The length of each of the first electrodes 33 is also substantially smaller than the width dimension thereof. Each of the first electrodes 33 have portions which extend over the thick insulation portions of the insulating member 30 bordering the thin insulating portion 58. A plurality of second electrodes 34 is provided on the insulating member 30 overlying the thin portion 58. Each of the electrodes 34 is of uniform length in the direction of the length dimension of the channel portion 57 and equal to the uniform length of the first electrodes 33. Each of the electrodes 34 have portions which extend over the thick insulating portions of insulating member 30 bordering the thin insulating portion 58. An insulating layer 35 is provided over the electrodes 63 and 64. A plurality of first transfer electrodes 37 are provided over the insulating layer 35. Each of the first transfer electrodes 37 is insulatingly spaced between a respective second electrode 34 and an adjacent succeeding first electrode 33 and overlying these electrodes. A plurality of second transfer electrodes 38 are provided over the insulating layer 35. Each of the second transfer electrodes 38 is insulatingly spaced between a respective first electrode 33 and an adjacent succeeding second electrode 34 and overlying these electrodes. Each of the transfer electrodes 37 and 38 is of substantially uniform extent in the direction of the length of the channel portion 57 and extends over the thin insulating portion 58 of the insulating member 30 as well as the bordering thick insulating portions thereof.

All of the first electrodes 33 of the shift register 12 are connected to line 41 to which a $\phi_D$ voltage is supplied from a fixed voltage source 45. All of the second electrodes 34 of the shift register 12 are connected to line 42 to which a $\phi_C$ voltage is supplied from a clocking waveform generator 46. All of the first transfer electrodes 37 of the shift register 12 are connected to a $\phi_D'$ line 43 to which a $\phi_D'$ voltage is supplied from fixed voltage source 45. All of the second transfer electrodes 38 of the shift register 12 are connected to a $\phi_C'$ line 44 to which a $\phi_C'$ voltage is applied from a clocking waveform generator 46.

Each of the four electrodes 38, 34, 37 and 33, corresponding to $\phi_C'$, $\phi_C$, $\phi_D'$ and $\phi_D$ electrodes serially arranged on a respective thin portion 58 of the insulating member 30 and overlying a respective part of channel 57 of the shift register form a stage thereof. The $\phi_C'$ electrode 38 of the first stage of the shift register 12 insulatingly overlies part 26 of long edge 24 of first electrode 15. Thus, charge transferred into the first storage region underlying the electrode 15 during one half of the clocking cycle is transferred out into the first stage of the second shift register 12 during the second half of the clocking cycle.

The operation of the apparatus of FIGS. 1 and 2 will now be explained in connection with the waveform diagrams of FIGS. 4A through 4E. A first sequence of charge samples or packets are generated by input circuit 28 and are serially applied to the shift register 11. Each packet is clocked from stage to stage over successive clocking cycles until it reaches the last stage. During the first half of a clocking cycle, $t_0$-$t_1$, a charge packet is transferred into the first storage region underlying electrode 15 of the last stage. During an interval $t_a$-$t_b$ during this half of the clocking cycle a pulse of gating voltage is applied to gating electrode establishing a conduction channel between the first storage region 16 and the third storage region 18 thereby combining the charges in these storage regions. While the interval $t_a$-$t_b$ is short, it is of sufficient duration to enable the charge in the first and third storage regions to equilibrate i.e. attain the same potential. Upon termination of the pulse the charge in the storage cell comprising the first and third storage regions is divided into a first part contained in the first storage region and a second part contained in the third storage region. Over the second half of the clocking cycle the first part of the combined charge is transferred into the second shift register 12. The first part of the combined charge is clocked in the second shift register from stage to stage to output circuit 60 from which an output is obtained. Over the next clocking cycle the next packet of charge in the input sequence is clocked into the first storage region underlying electrode 15, combined with the charge stored in the third charge storage region underlying electrode 17, and then divided into a first part stored in first storage region and second part stored in the third charge storage region. The first part is transferred to second shift register and the second part is retained in the third storage region. Thus, successive packets of a sequence are processed in the charge storage cell and clocked out as a second sequence of packets.

If a first sequence consisting of a single packet $Q_n$ were clocked into the first shift register, at the output of the second shift a second sequence would be obtained in which the initial packet would have a magnitude of $$Q_n \times \left(\frac{C_1}{C_1 + C_3}\right),$$

corresponding to the first part of the combined charge, where $C_1$ is the capacitance of electrode 15 with respect to the substrate, and $C_3$ is the capacitance of electrode 17 with respect to the substrate. The second output packet would have a magnitude of $$\left(\frac{C_1}{C_1 + C_3}\right) Q_n \left(\frac{C_3}{C_1 + C_3}\right).$$

The third output packet would have a magnitude of $$\left(\frac{C_1}{C_1 + C_3}\right) Q_n \left(\frac{C_3}{C_1 + C_3}\right)^2$$

and so on for the succeeding packets. This sequence of successive values represents the impulse response of the filter. The sequence is a decaying exponential function of the form $e^{-\alpha T}$, where $T$ is the clocking period and $\alpha$ is the attenuation constant. The attenuation constant $\alpha$ can be readily determined in the following manner. Over a single clock period $T$ the charge in the storage region 16 of the first shift register is reduced by a factor of $C_3/(C_1+C_3)$. Thus, $$\frac{C_3}{C_1 + C_3} = e^{-\alpha T}, \text{ or} \tag{1}$$

$$\alpha = -\frac{1}{T} \ln \frac{C_3}{C_1 + C_3}.$$

The output from such a filter in response to a sampled data input in the form of a sequence of charge packets is obtained by the convolution of the input sequence with the impulse response of the filter. The frequency response of the filter which is a low pass response is obtained by simply transforming the impulse response into the frequency domain.

To provide high speed operation in charge transfer shift registers the length of the charge storage regions, i.e. the dimension in the direction of charge transfer into and out of the storage regions, is made relatively small in relation to width thereof. Short lengths mean short charge transfer times and hence high speed. In accordance with the present invention the charge storage region 18 of the accumulator stage 13 is also provided with a short length in relation to the width thereof. Also the width or long dimension of the storage region 18 is oriented parallel to the long dimension of the storage region 16 of the last stage of the first shift register thereby reducing to minimum values the equilibration times for the charge stored in these regions and hence providing high speed operation in the filter. Lateral conductivity or conductivity along the width dimension of the storage region 16 is enhanced by the region 51 of opposite conductivity type contiguous therewith. The conductivity of region 51 is further enhanced by conductive strip 53.

The length of the storage region 18 and also the width thereof can be changed, as desired, to provide the desired value of the attenuation constant α. The length of the region 18 is kept sufficiently short consistent with the speed of operation desired. The attenuation constant α can have values between one and zero. When storage region 18 is small in relation to storage region 16 α has a value close to unity. When storage region 18 is large in relation to storage region 16 α has a value close to zero.

Reference is now made to FIG. 5 which shows a modification of the apparatus 10 of FIG. 1. The structure and operation of the modified apparatus is identical to the structure and operation of the apparatus of FIG. 1 except for the modification shown in FIG. 5. Elements of the apparatus of FIG. 5 identical to the elements of the apparatus of FIG. 1 are identically designated. In the apparatus of FIG. 5 the charge storage function of the storage region 18 of FIG. 1 is provided by a discrete capacitor 61 which is constituted independent of the semiconductor substrate 20 although it may be formed on the thick oxide layer 30 overlying the substrate. The apparatus of FIG. 5 includes a region 62 of opposite conductivity type and high conductivity in the substrate. The region 62 is of elongated configuration and has a long side 63 spaced a short distance from and parallel to a long side of the first storage region 16 underlying long edge 24 of electrode 15. Thus, a short channel region is provided between the first storage region 16 and the region 62 of opposite conductivity type. Gating electrode 27 insulatingly overlies the channel region. Conduction in the channel region and hence conduction between storage region 16 and capacitor 61 is controlled by the gating voltage $\phi_G$ of FIG. 4E applied to the gating electrode. One terminal of capacitor 61 is connected to the region 62 and the other terminal is connected to substrate 20 which is grounded.

Reference is now made to FIG. 6 which shows another modification of the apparatus 10 of FIG. 1 similar to the modification of FIG. 5. The structure and operation of the modified apparatus is identical to the structure and operation of the apparatus of FIG. 1 except for the modification shown in FIG. 6. Elements of the apparatus of FIG. 6 identical to the elements of the apparatus of FIG. 1 are identically designated. In the apparatus of FIG. 6 the charge storage function of the storage region 18 of FIG. 1 is replaced by a discrete capacitor 65 which is constituted independent of the semiconductor substrate 20 although it may be formed on the thick oxide layer 30 overlying the substrate. The apparatus of FIG. 66 includes a region 66 of opposite conductivity type and high conductivity in the substrate. The region 66 is of elongated configuration and has a long side 67 spaced a short distance from and parallel to a long side 68 of the region 51 of opposite conductivity type. Thus, a short channel region is provided between the region 66 of opposite conductivity type and the region 51 of opposite conductivity type. Gating electrode 69 insulatingly overlies the channel region. Conduction in the channel region and hence conduction between storage region 16 and capacitor 65 is controlled by the gating voltage $\phi_G$ applied to the gating electrode. One terminal of capacitor is connected to region and the other terminal is connected to substrate 20.

In the filter of FIG. 1 both the input signal and the output signal are in the form of a sequence of packets of charge. The output sequence is obtained by convolving the input sequence with the impulse response of the filter. Such a filter may be readily cascaded with other similarly constituted filters in which an input is applied and an output is obtained in the form of a sequence of charge packets. Such filters are described and claimed in U.S. patent applications Ser. Nos. 105,756, 105,757, and 105,758, filed Dec. 20, 1979 and assigned to the assignee of the present invention.

While input circuit 28 is provided to convert an input signal into a sequence of charge packets for application to the first shift register, such a circuit is not necessary if the signal is in the form of a sequence of charge packets. In the latter case the sequence of packets may be directly applied to the first shift register.

While the filter of FIGS. 1-3 utilizes charge transfer devices in which charge storage and transfer occurs in cells adjacent the surface of the semiconductor substrate, the present invention may be implemented with cells of opposite conductivity type regions. Structures of this type, commonly referred to as buried channel charge transfer devices, described in U.S. Pat. No. 3,902,187, assigned to the assignee of the present invention and incorporated herein by reference thereto. In such buried channel charge transfer devices charge storage and transfer occurs in cells below the surface of the semiconductor substrate. Implementation of prior art charge transfer filters with buried channel devices has particular advantages with respect to high speed operation, but suffers from nonlinearities resulting from the variable capacitance between the charge storage cells and their associated overlying electrodes. In the present invention such nonlinearities are not introduced into the output. In connection with a buried channel implementation, of course, surface charge input circuits such as those described above could be used.

The filter apparatus of the present invention may also be implemented in bucket brigade technology; however, such implementation would be less advantageous than in the charge coupled technology shown and described in FIGS. 1-3, as bucket bricade devices are subject to charge transfer inaccuracies which limit their performance.

While the invention has been described in specific embodiments in which a single phase clocking system has been employed, it will be understood that other clocking systems such as multi-phase clocking systems may as well be employed.

While the invention has been described in connection with apparatus constituted of N-type conductivity substrates, P-type conductivity substrates could as well be used. Of course, in such a case the applied potentials would be reversed in polarity.

While the invention has been described in specific embodiments, it will be understood that modifications, such as those described above, may be made by those skilled in the art, and it is intended by the appended claims to cover all such modifications and changes as fall within the true spirit and scope of the invention.

What we claim as new and desire to secure by Letters Patent of the United States is:

1. In combination,
   a substrate of semiconductor material of one conductivity type,
   means for forming a charge storage region in said substrate and for transferring charge therein including a first electrode of generally elongated outline insulatingly overlying said storage region, said first electrode forming with said substrate a first capacitor,
said first electrode having a length in the direction of charge transfer thereunder which is substantially smaller than the width thereof,
a first region of opposite conductivity type and high conductivity in said substrate, said first region being of elongated configuration and having a long side contiguous with a long side of said first storage region,
a second region of opposite conductivity type and high conductivity in said substrate, said second region being of elongated configuration and having a long side spaced a short distance from and parallel to another long side of said first storage region,
a second capacitor having a pair of terminals, one of said terminals connected to said second region of opposite conductivity type and the other of said terminals connected to said substrate,
said first and second capacitors forming a charge storage cell,
means for providing a sequence of first quantities of charge, each quantity corresponding to a respective value of a series of successive values of a signal,
introducing means including said first electrode for introducing serially each of said quantities of charge of said sequence into said storage cell,
removing means including said first electrode for removing periodically a fixed fraction less than one of the total of said first quantities of charge contained in said storage cell to provide a sequence of second quantities of charge, said fixed fraction of charge periodically removed from said storage cell by said removal means being determined by the ratio of the capacitance of said first capacitor to the total capacitance of said first and second capacitors.

2. In combination,
a substrate of semiconductor material of one conductivity type having a major surface,
means for forming a charge storage cell in said substrate and for transferring charge therein including a first electrode of generally elongated outline and a second electrode of generally elongated outline, each insulatingly overlying said storage cell, said charge storage cell including a first storage region in said substrate underlying said first electrode and a second storage region in said substrate underlying said second electrode, said first electrode forming with said substrate a first capacitor, said second electrode forming with said substrate a second capacitor,
said first electrode having a length in the direction of charge transfer thereunder which is substantially smaller than the width thereof,
said second electrode having a length in the direction of charge transfer thereunder which is substantially smaller than the width thereof,
a long edge of said second electrode spaced a short distance from and parallel to a part of a long edge of said first electrode,
a first region of opposite conductivity type and high conductivity in said substrate contiguous with the long side of said first storage region remote from said one long edge of said first electrode,
a metallic member contiguous with said first region of opposite conductivity type along the width thereof,
means for providing a sequence of first quantities of charge, each quantity corresponding to a respective value of a series of successive values of a signal,
introducing means including said first electrode for introducing serially each of said quantities of charge of said sequence into said storage cell,
removing means including said first electrode for removing periodically a fixed fraction less than one of the total of said first quantities of charge contained in said storage cell to provide a sequence of second quantities of charge, said fixed fraction of charge periodically removed from said storage cell by said removal means being determined by the ratio of the capacitance of said first capacitor to the total capacitance of said first and second capacitors.

3. In combination,
a substrate of semiconductor material of one conductivity type having a major surface,
means for forming a charge storage cell in said substrate and for transferring charge therein including a first electrode of generally elongated outline and a second electrode of generally elongated outline, each insulatingly overlying said storage cell, said charge storage cell including a first storage region in said substrate underlying said first electrode and a second storage region in said substrate underlying said second electrode, said first electrode forming with said substrate a first capacitor, said second electrode forming with said substrate a second capacitor,
said first electrode having a length in the direction of charge transfer thereunder which is substantially smaller than the width thereof,
said second electrode having a length in the direction of charge transfer thereunder which is substantially smaller than the width thereof,
a long edge of said second electrode spaced a short distance from and parallel to a part of a long edge of said first electrode,
a first region of opposite conductivity type and high conductivity in said substrate contiguous with the long side of said first storage region remote from said one long edge of said first electrode,
a second region of opposite conductivity type and high conductivity contiguous with said second storage region along the side thereof remote from said one long edge of said first storage electrode, the area of said second region of opposite conductivity type in said major surface being equal to the area of said first region of opposite conductivity in said major surface multiplied by the ratio of the area of said second electrode to the area of said first electrode,
a metallic member contiguous with said second region of opposite conductivity type along the width thereof,
means for providing a sequence of first quantities of charge, each quantity corresponding to a respective value of a series of successive values of a signal,
introducing means including said first electrode for introducing serially each of said quantities of charge of said sequence into said storage cell, removing means including said first electrode for removing periodically a fixed fraction less than one of the total of said first quantities of charge contained in said storage cell to provide a sequence of second quantities of charge, said fixed fraction of charge periodically removed from said storage cell by said removal means being determined by the ratio of the capacitance of said first capacitor to the total capacitance of said first and second capacitors.

* * * * *